(12) United States Patent
Suematsu et al.

(10) Patent No.: US 6,519,198 B2
(45) Date of Patent: Feb. 11, 2003

(54) SEMICONDUCTOR MEMORY DEVICE

(75) Inventors: Yasuhiro Suematsu, Yokohama (JP); Masaru Koyanagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/935,010

(22) Filed: Aug. 21, 2001

(65) Prior Publication Data

US 2002/0031027 A1 Mar. 14, 2002

(30) Foreign Application Priority Data

Aug. 24, 2000 (JP) ........................................ 2000-253888

(51) Int. Cl.[7] ................................................. G11C 7/00
(52) U.S. Cl. ........................ 365/205; 365/203; 365/207
(58) Field of Search ................................. 365/205, 203, 365/207, 189.01

(56) References Cited

U.S. PATENT DOCUMENTS

| 5,638,333 | A | * | 6/1997 | Lee | ............................... | 327/51 |
| 5,703,819 | A | * | 12/1997 | Gotoh | ........................ | 365/154 |
| 5,862,089 | A | * | 1/1999 | Raad et al. | .................. | 365/203 |
| 6,115,316 | A | * | 9/2000 | Mori et al. | ............ | 365/189.09 |
| 6,198,683 | B1 | * | 3/2001 | Ishii et al. | ............. | 365/189.09 |
| 6,285,613 | B1 | * | 9/2001 | Koya | ........................ | 365/149 |
| 6,344,760 | B1 | * | 2/2002 | Pyo | .............................. | 326/81 |

FOREIGN PATENT DOCUMENTS

JP 11-086553 3/1999

* cited by examiner

*Primary Examiner*—Hoai Ho
(74) *Attorney, Agent, or Firm*—Hogan & Hartson, LLP

(57) ABSTRACT

The bit line overdrive circuit of the present invention comprises a VBLH potential generation circuit generating a bit line final potential relative to a VBLH power supply line for driving a sense amplifier, a charge adjusting capacitance C, a transistor for supplying an overdrive potential to the VBLH power supply line, and a transistor for connecting a PCS node to the VBLH power supply line. The charge pre-charged from the overdrive potential to the VBLH power supply line is shared among the capacitance of the above-noted circuit elements connected to the VBLH power supply line, the bit line capacitance, and the capacitance of a cell capacitor so as to form a VBLH power supply of a substantially one system, thereby avoiding the generation of a power supply noise caused by the power supply switching.

14 Claims, 4 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2000-253888, filed Aug. 24, 2000, the entire contents of which are incorporated herein by reference.

BACKGROUND OF THE INVENTION

1. Field of the Invention

The present invention relates to a semiconductor memory device, particularly, to the high speed operation of a DRAM (Dynamic Random Access Memory).

2. Description of the Related Art

Various efforts have been made to data in an attempt to develop semiconductor memory devices such as DRAM having a high degree of integration and capable of achieving a high speed operation. On the other hand, the operation margin tends to be lowered because of the lowered power supply voltage caused by the progress of the fine process technology and because of the achievement of the high speed operation. The main reason for the difficulty is that it is difficult to lower the threshold voltage of the transistor in accordance with the lowered power supply voltage. Particularly, under an environment of a low power supply voltage, the operation margin of a circuit in which the wiring of a large capacitance is charged in a short time, e.g., a bit line sense circuit, tends to be lowered.

In order to overcome the problem, a bit line potential overdrive circuit for overdriving the potential of the bit line in charging the bit line has been used. FIGS. 1A and 1B collectively show the construction of the conventional bit line potential overdrive circuit.

FIG. 1A shows the circuit construction of a DRAM, particularly, the memory region relating to the bit line potential overdrive circuit. The memory region of the DRAM shown in FIG. 1A comprises a memory cell array 10 formed by arranging memory cells in the form of a matrix, a row decoder 11, a sense amplifier 12 arranged for column of the memory cell array, a bit line 5 and a complementary bit line 6.

FIG. 1B shows in a magnified fashion the circuit construction of the region denoted by an arrow in FIG. 1A. To be more specific, FIG. 1B shows the typical circuit construction of each of a memory cell, a word line connected to the memory cell, a pair of bit lines, a sense amplifier for driving the bit lines, and an equalize circuit for equalizing the pair of bit lines.

The circuit shown in FIG. 1B comprises an equalize circuit formed of N-channel transistors Q11, Q12, Q13, a sense amplifier formed of P-channel transistors Q1n, Q3n and N-channel transistors Q2n, Q4n (n being a natural number), N-channel transistors Qs1, Qs2, a cell capacitor Cc, and a memory cell formed of a single cell transistor Qc.

Reference numerals 3 and 4 represent an NCS node and a PCS node, respectively. The voltage on the side of the P-channel transistor and the voltage on the side of the N-channel transistor each serving to activate the sense amplifier are applied to the NCS node 3 and the PCN node 4, respectively. Reference numerals 5 and 6 represent a bit line BL and a complementary bit line /BL, respectively. Reference numeral 7 represents a signal line ISO for coupling the sense amplifier and the memory cell. Further, reference numeral 8 represents a word line WL. Incidentally, EQL represents an equalize signal line. If EQL is set at a high level, the potentials of the bit line BL and the complementary bit line /BL are set at VBLEQ, which is half the bit line final potential VBLH.

The conventional bit line potential overdrive circuit, which is directly relevant to the present invention, will now be described with reference to FIG. 2.

The bit line potential overdrive circuit shown in FIG. 2 comprises 0-th to n-th sense amplifiers formed between the PCS node 3 and the NCS node 4, 0-th to n-th bit line pairs driven by these sense amplifiers, a P-channel transistor Q5 serving to impart a bit line overdrive potential VINT to the PCS node upon receipt of a control signal /PSE1, a P-channel transistor Q6 serving to impart a bit line final potential VBLH to the PCS node upon receipt of a control signal /PSET2, and an N-channel transistor Q7 making the NCS node to the ground potential Vss upon receipt of a control signal NSET.

The operation of the conventional bit line potential overdrive circuit will now be described with reference to FIG. 2 with attentions paid to the n-th sense amplifier and the bit line pair. The circuit construction of the n-th sense amplifier consisting of n-th P-channel transistors Q1n, Q3n and n-th N-channel transistors Q2n, Q4n is equal to that shown in FIG. 1B.

AS shown in FIG. 2, in the n-th sense amplifier, the P-channel transistor Q1n and the N-channel transistor Q2n form a first complementary inverter, and the P-channel transistor Q3n and the N-channel transistor Q4n form a second complementary inverter.

The output of the first complementary inverter is connected to the input of the second complementary inverter via the complementary bit line /BL, and the output of the second complementary inverter is fed back to the first complementary inverter via the bit line BL so as to form a sense amplifier consisting of a complementary flip-flop.

The charge stored in the cell capacitor Cc having a miniature capacitance is amplified in the sense amplifier via the cell transistor Qc and the bit line of large wiring capacitance. Also, the stored memory data amplified by the sense amplifier is then restored in the cell capacitor Cc.

In order to rapidly amplify the charge stored in the cell capacitor Cc having a miniature capacitance via a large bit line capacitance, it is effective to add a bit line potential overdrive circuit serving to supply the charge required for changing the bit line in a short time to the sense amplifier.

The operation of the bit line potential overdrive circuit shown in FIG. 2 will now be described more in detail with reference to FIG. 3 showing the timing wave form diagram.

As described previously, power supplies of two systems supplying the bit line overdrive potential VINT and the bit line final potential VBLH (VBLH<VINT) are prepared for the PCS node of the conventional bit line potential overdrive circuit, and the bit line charging time is shortened by connecting the bit line to the power supply of the overdrive potential VINT higher than the final potential VBLH in the initial stage of the bit line charging.

FIG. 3 exemplifies the operation timing wave form of the bit line overdrive circuit. The operation of the conventional bit line overdrive circuit will now be described with reference to FIG. 3, where (1), (2) and (3) show respective time regions.

(1) Since each of /PSET1 and /PSET2 has a high level (hereinafter referred to as "H"), both Q5 and Q6 are in the off-state, NSET has a low level (hereinafter referred to as "L"), and Q7 is in the off-state, the sense amplifier is under a stand-by (inactive) state and the potential of each of PCS and NCS is set at VBLH/2. Also, since the word line WLn is "L" and Qc is in the off-state, the cell capacitor Cc is separated from the bit line BLn.

(2) Since the states that /PSET1 is "H", /PSET2 is "H", and that NSET is "L" are left unchanged, the stand-by state of the sense amplifier is maintained. The word line WLn is set at "H" and the charge of the cell capacitor Cc is read on the bit line BLn.

(3) If NSET is set at "H" with each of /PSET1 and /PSET2 maintained at "H", the transistor Q7 is turned on so as to activate the N-channel side of the sense amplifier and lower the potential of the complementary bit line /BLn to Vss. Then, if the transistor Q5 is turned on with /SET1 set at "L", the bit line BLn is connected to the power supply of the overdrive potential VINT so as to activate the P-channel side of the sense amplifier. It follows that the potential of the bit line BLn is rapidly elevated. If /PSET1 is brought back to "H" so as to turn off the transistor Q5 and, at the same time, /PSET2 is set at "L" so as to turn off the transistor Q6 before the potential of the bit line BLn reaches the final potential VBVLH, the power supply connected to the bit line BLn is switched to the power supply for imparting the final potential VBLH of the bit line from VINT.

If the potential of the bit line BLn is overdriven to a potential close to the final potential VBLH until the power supply switching time, it suffices to slightly charge the bit line BLn after the switching to the power supply of the final potential VBLH. It follows that it is possible to ensure a sufficient operation margin in the high speed operation of the DRAM.

As described above, the voltage Vds between the source and the drain of the P-channel transistor included in the sense amplifier can be increased by connecting the power supply of the overdrive potential VINT to the PCS node, making it possible to charge at a high speed the bit line BLn in the initial sensing operations.

However, the conventional bit line potential overdrive circuit gives rise to a problem. Specifically, the conventional bit line potential overdrive circuit requires power supplies of two systems including the power supply for imparting a bit line overdrive potential to each sense amplifier region and the power supply for imparting the bit line final potential and large size transistors of two systems for controlling the connection and the switching of these power supplies. As a result, the wiring area is increased so as to increase the chip size of the DRAM.

What should also be noted is that, in order to prevent the overcharging of the bit line, in which the potential of the bit line BLn becomes higher than the final potential VBLH, it is necessary to switch the path of the power supply before the overdriven bit line potential reaches the final potential VBLH, giving rise to the problem that the power supply noise is increased.

As described above, the conventional bit line potential overdrive circuit requires the power supplies of two systems for each sense amplifier, giving rise to the problem that the chip size of the DRAM is increased. Also, it is necessary to switch the power supplies of the two systems in the vicinity of the final potential of the bit line, giving rise to the problem that the power supply noise is increased.

BRIEF SUMMARY OF THE INVENTION

The semiconductor memory device according to one embodiment of the present invention is constructed such that a VBLH potential generation circuit for generating a bit line final potential VBLH is arranged in bit line potential overdrive circuit, and a bit line overdrive potential higher than the bit line final potential VBLH is supplied to a VBLH power supply line through a first switch so as to allow a power supply inherent in the bit line potential overdrive circuit to be substantially of a single system. Also, in the semiconductor memory device of the present invention, the output of the VBLH potential generation circuit and a charge adjusting capacitance are connected to the VBLH power supply line, and the overdrive potential is transmitted to the VBLH power supply line through the first switch. Further, the potential of the VBLH power supply line is transmitted to one activation node of a sense amplifier through a second switch.

Also, the semiconductor memory device according to the embodiment of the present invention is featured mainly in that the first switch is turned on with the second switch turned off so as to separate the sense amplifier from the VBLH power supply line, thereby pre-charging the total capacitance of the VBLH power supply line from the overdrive potential, followed by transmitting the pre-charged potential to the bit line through one activation node of the sense amplifier by switching the first switch to the off-state and the second switch to the on-state, thereby operating the bit line overdrive circuit.

According to a first aspect of the present invention, there is provided a semiconductor memory device equipped with a bit line overdrive circuit, comprising:

a final potential generation circuit for imparting a final potential after the overdrive to a bit line;

a first switch having one terminal set at an overdrive potential of the bit line higher than the final potential and having the other terminal connected to the output of the final potential generating circuit;

a second switch having one terminal connected to the other terminal of the first switch and having the other terminal connected to one activation node of a sense amplifier; and a charge adjusting capacitance for adjusting the potential of the bit line, one terminal of the charge adjusting capacitance being connected to the connection points between the first and second switches and the other terminal being set at a predetermined voltage.

According to a second aspect of the present invention, there is provided a bit line overdriving method for a semiconductor memory device, comprising:

setting one terminal of a first switch at a bit line overdrive potential higher than a bit line final potential;

connecting the other terminal of the first switch to the output of the bit line final potential generation circuit;

connecting one terminal of a second switch to the other terminal of the first switch;

connecting the other terminal of the second switch to one activation node of a sense amplifier;

connecting one terminal of a charge adjusting capacitance for adjusting the bit line potential to the connecting point between the first and second switches;

setting the other terminal of the charge adjusting capacitance at a predetermined voltage;

charging the total capacitance at the connecting point between the first and second switches including the charge adjusting capacitance and the capacitance of the bit line final potential generation circuit to the overdrive potential with the first switch turned on and the second switch turned off; and discharging the charge charged in the total capacitance at the connecting point between the first and second switches to the bit line through one activation node of the sense amplifier with the first switch turned off and the second switch turned on.

Further, according to a third aspect of the present invention, there is provided a bit line overdriving method for a semiconductor memory device, comprising:

charging the total capacitance at the connecting point between the first and second switches including the charge adjusting capacitance and the capacitance of the bit line final potential generation circuit with the first switch turned on and the second switch turned off;

supplying a charging current from a power supply of the overdrive potential to the bit line through one activation node of the sense amplifier by switching the second switch to the on-state while maintaining the on-state of the first switch; and discharging the charge charged in the total capacitance at the connecting point between the first and second switches to the bit line through one activation node of the sense amplifier by switching the first switch to the off-state while maintaining the on-state of the second switch.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Some embodiments of the present invention will now be described in detail with reference to the accompanying drawings.

<First Embodiment>

Figure 4:
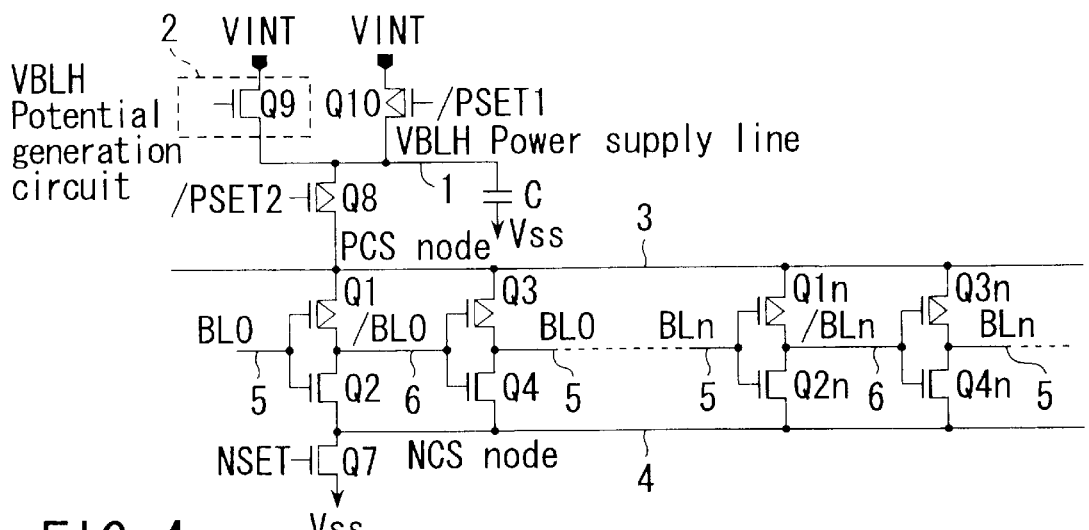
FIG. 4 shows the construction of a bit line overdrive circuit according to a first embodiment of the present invention.

FIG. 4 exemplifies the construction of a bit line potential overdrive circuit of a DRAM according to a first embodiment of the present invention.

The bit line potential overdrive circuit according to the first embodiment of the present invention, which is shown in FIG. 4, is featured in that the circuit comprises a VBLH power supply line 1. To be more specific, in the conventional bit line potential overdrive circuit, the power supply of the bit line overdrive potential VINT and the power supply of the bit line final potential VBLH are connected to the PCS node. In the first embodiment of the present invention, however, a VBLH potential generation circuit 2 for allowing the power supply of VINT to generate a potential of VBLH, a transistor Q10 for supplying the overdrive potential VINT to the bit line BLn, and the charge adjusting capacitance C are connected to the VBLH power supply line 1, and the VBLH power supply line 1 is connected to the PCS node 3.

In the prior art, the bit line overdrive potential serves to overdrive directly the bit line. In the first embodiment of the present invention, however, the bit line overdrive potential VINT serves to charge (pre-charge) the total capacitance of the VBLH line 1 including the charge adjusting capacitance C to a potential in the vicinity of the final potential VBLH (VBLH<VINT). The potential of the bit line BLn is finally imparted by the VBLH potential generation circuit 2 and is held.

To be more specific, as shown in FIG. 4, the charge adjusting capacitance 10, the P-channel transistor Q10 serving to connect the power supply of the bit line overdrive potential VINT to the VBLH power supply line 1 upon receipt of the control signal /PSET1, and a VBLH potential generation circuit 2 generating the bit line final potential VBLH by using the power supply of the potential VINT are connected to the VBLH power supply line 1.

Figure 1A:
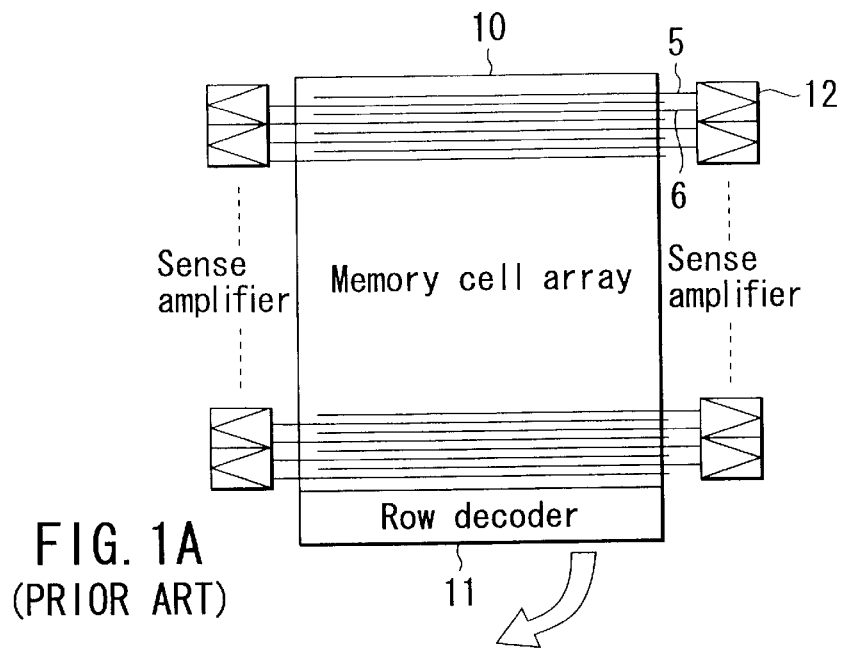
FIG. 1A is a block diagram showing the construction of the memory region included in the conventional semiconductor memory device.
Figure 1B:
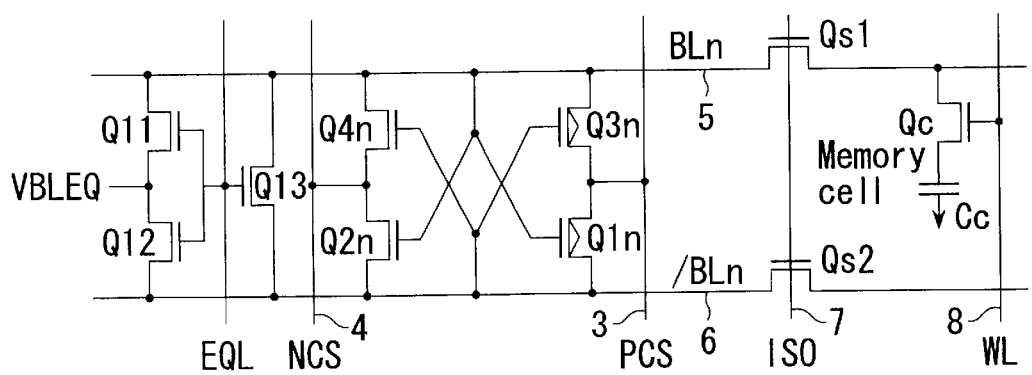
FIG. 1B shows the circuit construction of each of the memory cell, the bit line, the sense amplifier and the equalizer circuit included in the conventional semiconductor memory device.
Figure 2:
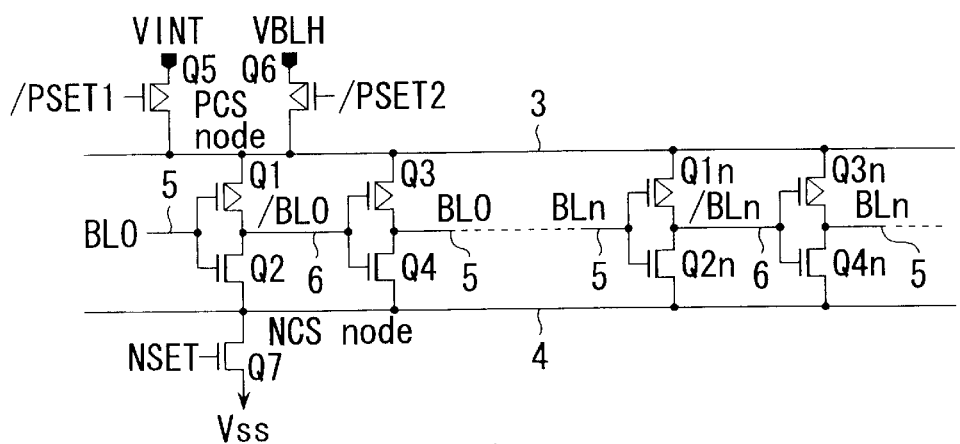
FIG. 2 shows the construction of the conventional bit line overdrive circuit.
Figure 3:
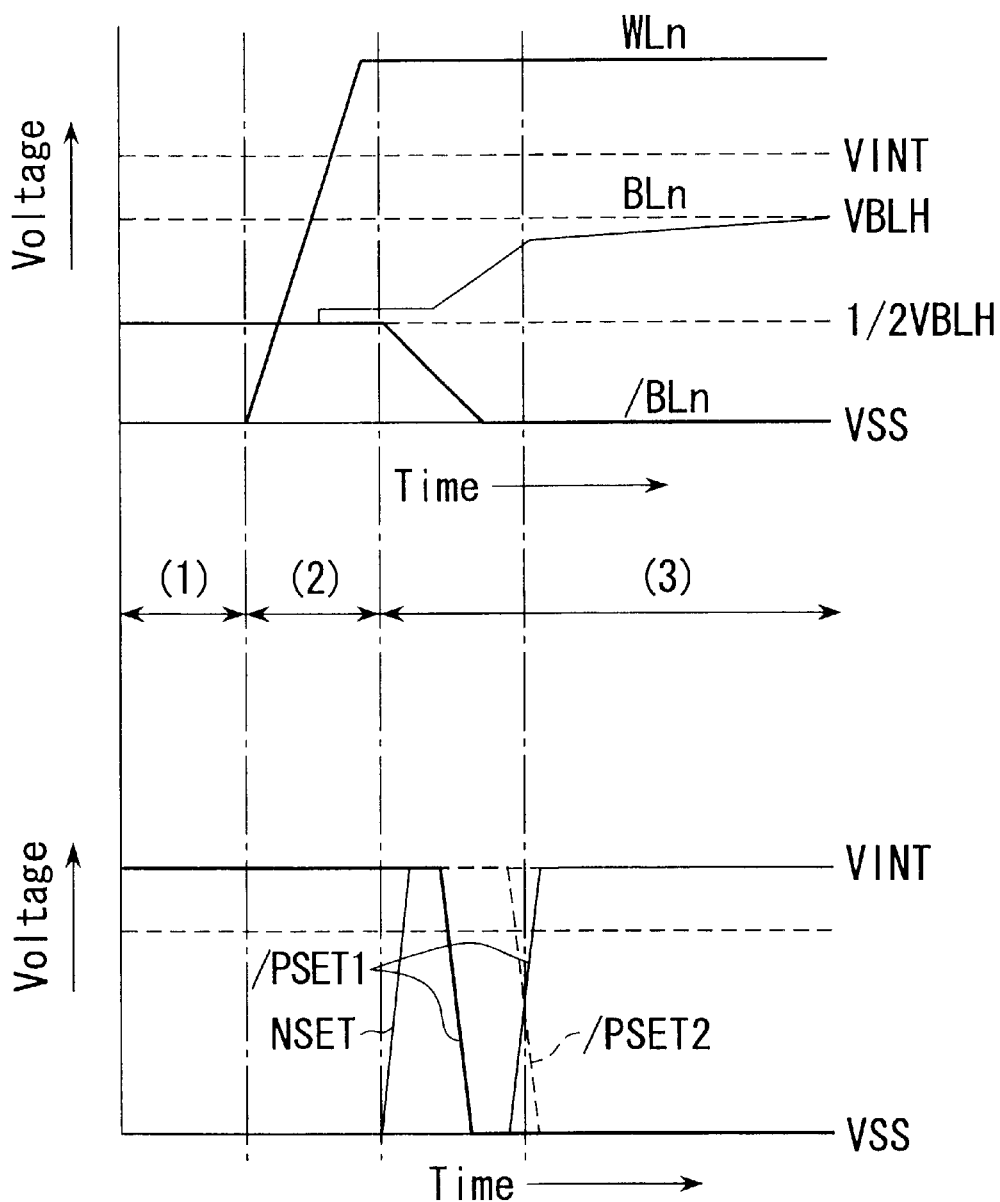
FIG. 3 is a timing wave form diagram showing the operation of the conventional bit line overdrive circuit.

Also, the P-channel transistor Q8 serving to transfer the potential of the VBLH power supply line 1 to the PCS node 3 upon receipt of the control signal /PSET2 is connected to the VBLH power supply line 1. The construction of the other portion is equal to that shown in FIG. 2 and, thus, the same constituents are denoted by the same reference numerals so as to avoid an overlapping description.

The operation of the bit line potential overdrive circuit of the DRAM according to the first embodiment of the present invention will now be described in detail with reference to the timing wave form diagram shown in FIG. 5. As described previously, the bit line potential overdrive circuit according to the first embodiment of the present invention widely differs from the conventional bit line potential overdrive circuit in the circuit operation in respect of the method of using the VBLH power supply.

The operation of the bit line overdrive circuit will now be described with reference to FIG. 5.

(1) While the word line WLn is set at "L" and the cell capacitor Cc is separated from the bit line BLn, /PSET1 is set at "L" and the transistor Q10 is turned on so as to connect the power supply of the potential VINT to the VBLH power supply line 1. Also, /PSET2 is set at "H" and the transistor Q8 is turned off so as to separate the PCS node 3 from the VBLH power supply line 1. In this fashion, the potential of the VBLH power supply line is charged (pre-charged) to the potential VINT (VINT>VBLH).

It should be noted that, since the /PSET2 is set at "H", the transistor Q8 is turned off, the NSET is set at "L", and the transistor Q7 is turned off in this case, the sense amplifier is in the stand-by state and, thus, the potential of each of PCS and NCS is set at VBLH/2.

(2) The word line WLn is set at "H" so as to connect the cell capacitor Cc to the bit line BLn through the cell transistor Qc. The charge of the cell capacitor Cc is read out to the bit line BLn. Then, the /PSET1 is set at "H" and the transistor Q10 is turned off so as to separate the power supply of the bit line overdrive potential VINT from the VBLH power supply line 1. Incidentally, since the states that the /PSET2 is set at "H" and that the NSET is set at "L" are left unchanged, the stand-by state of the sense amplifier is maintained.

(3) If the NSET is set at "H" under the states that the /PSET1 is set at "H" and that the /PSET2 is set at "H", the transistor Q7 is turned on so as to activate the N-channel side of the sense amplifier and, thus, to lower the potential of the complementary bit line /BLn to Vss. Then, if the /PSET2 is set at "L" so as to turn on the transistor Q8, the VBLH power supply line 1 charged to the bit line overdrive potential VINT and the bit line BLn are connected to each other so as to activate the P-channel side of the sense amplifier and, thus, the potential of the bit line BLn is rapidly elevated as shown in the upper stage of FIG. 5. Also, since the charge stored in the VBLH power supply line 1 is released, the potential of the VBLH power supply line 1 is lowered from VINT to VBLH as shown in the lower stage of FIG. 5.

As described above, the charge of the cell capacitor Cc is read out to the bit line BLn. Also, the charge of the VBLH power supply line charged to the bit line overdrive potential VINT is transmitted through the route of the activated sense amplifier, the bit line BLn (or complementary bit line /BLn), the transfer transistor Qc, and the cell capacitor Cc via the transistor Q8, with the result that the cell capacitor Cc is restored in the bit line final potential VBLH.

The value of the bit line final potential VBLH, which is determined by the operation that the charge of the VBLH power supply line 1 charged to the bit line overdrive potential VINT is discharged through the route noted above, is determined by the charge share based on the total of the capacitance of the VBLH power supply line 1, the parasitic capacitance of the VBLH potential generation circuit 2 and the charge adjusting capacitance C connected to the VBLH power supply line 1, the capacitance of the bit line BLn and the capacitance of the memory cell.

It follows that, if the balance of these capacitance values is optimized, it is possible to charge the bit line and the memory cell to VBLH without operating the VBLH potential generation circuit 2. However, because of the nonuniformity of the manufacturing process, it is practically difficult to make the bit line final potential exactly equal to VBLH. Therefore, in the first embodiment of the present invention, prepared is the VBLH potential generation circuit 2 so as to make the bit line final potential exactly equal to VBLH.

According to the overdrive circuit of the semiconductor memory device according to the first embodiment of the present invention, it is possible to use one system of substantially VBLH alone as the power supply for imparting the overdrive potential to the bit line, making it possible to decrease the chip size, compared with the conventional semiconductor memory device. Also, it is unnecessary to switch the supply path of the bit line charge potential during activation of the sense amplifier, which is required in the prior art, and it suffices to redistribute the charge pre-charged to the VBLH power supply line to the bit line capacitor and the cell capacitor. As a result, the generation of the power supply noise can be markedly suppressed.

<Second Embodiment>

A second embodiment of the present invention will now be described with reference to FIG. 6. The second embodiment is directed to the circuit for adjusting the value of the charge adjusting capacitance C added to the VBLH power supply line described previously in conjunction with the first embodiment.

If the final potential of the bit line is made as close to VBLH as possible in the bit line potential overdrive circuit described previously in conjunction with the first embodiment, it is possible to suppress the power consumption of the VBLH potential generation circuit. Also, it is possible to eliminate the VBLH potential generation circuit, if the final potential of the bit line is allowed to coincide with VBLH with a high accuracy. Such being the situation, it is desirable to adjust the value of the charge adjusting capacitance C added to the VBLH power supply line as precisely as possible.

Figure 6:
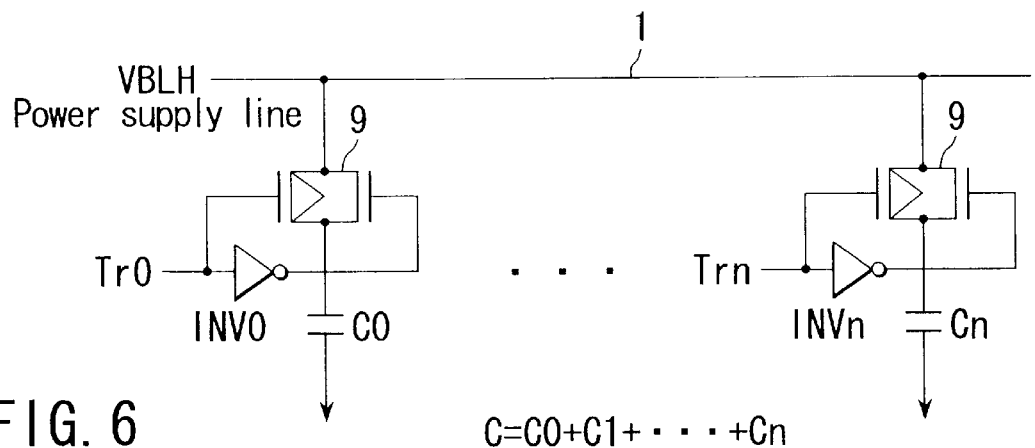
FIG. 6 shows the construction of a trim circuit of a charge adjusting capacitance according to a second embodiment of the present invention.

The construction of the adjusting circuit of the charge adjusting capacitance C according to the second embodiment of the present invention is shown in FIG. 6. As shown in the drawing, the adjusting circuit of the charge adjusting capacitance C comprises a VBLH power supply line 1, a transfer gate 9 consisting of a pair of a P-channel transistor and an N-channel transistor, inverters INV0 to INVn, and miniature capacitors C0 to Cn for adjusting the charge. The other terminals of the miniature capacitors C0 to Cn are connected to the ground or Vss. The charge adjusting capacitance C is the sum of the capacitance values of C0 to Cn.

If any of the trim signals Tr0 to Trn supplied to the inverters INV0 to INVn is set at "H", the corresponding miniature capacitor is connected to the VBLH power supply line 1 via the transfer gate 9. On the other hand, if any of the trim signals Tr0 to Trn supplied to the inverters INV0 to INVn is set at "L", the corresponding miniature capacitor is separated from the VBLH power supply line 1.

The trim signals Tr0 to Trn are prepared as a part of the signals included in the test program of the function test conducted after the manufacture of the semiconductor memory device. In the function test, the combination of "H" and "L" of the trim signals Tr0 to Trn optimizing the operation of the semiconductor memory device is determined and coded.

The trim signals Tr0 to Trn thus coded are written in, for example, a fuse ROM (Read Only Memory) integrated in the semiconductor memory device. When the semiconductor memory device is operated, the coded trim signals are read out so as to optimize the value of the charge adjusting capacitance C.

<Third Embodiment>

Figure 7:
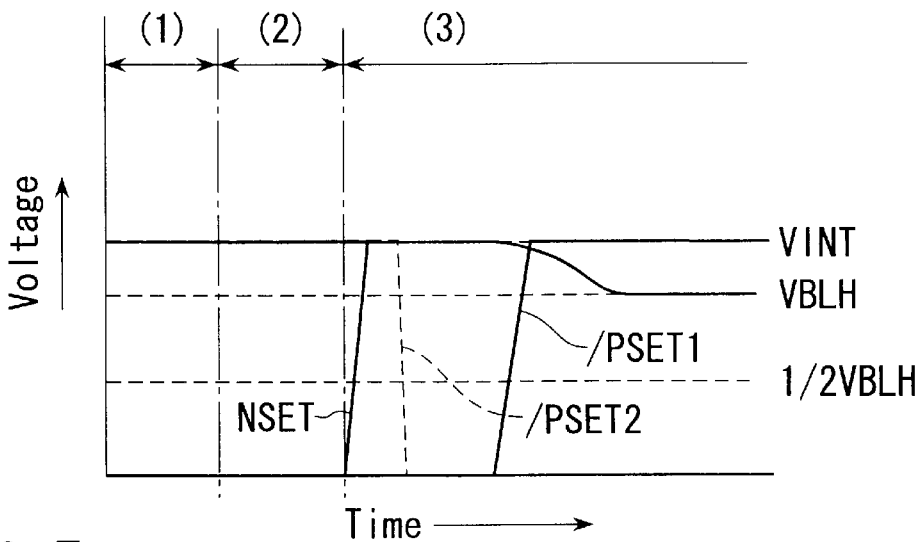
FIG. 7 is a timing wave form diagram showing the operation of the bit line overdrive circuit according to a third embodiment of the present invention.

A third embodiment of the present invention will now be described with reference to FIG. 7. In the third embodiment, it will be described that it is possible for the timing of the operation to separate the VBLH power supply line 1 from the power supply of the bit line overdrive potential VINT with the control signal /PSET1 set at "H" and the transistor Q10 turned off to be different from that in the first embodiment.

Figure 5:
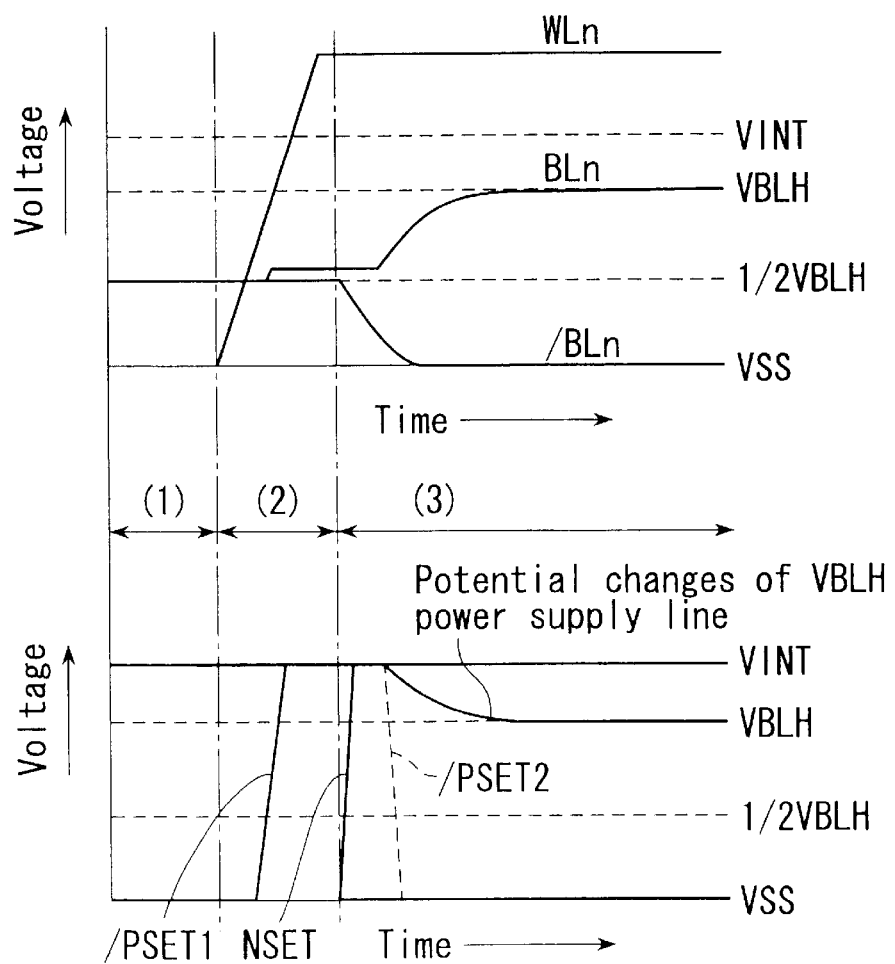
FIG. 5 is a timing wave form diagram showing the operation of the bit line overdrive circuit according to the first embodiment of the present invention.

In the bit line potential overdrive circuit described previously in conjunction with the first embodiment, the operation to set the control signal /PSET1 at "H" was performed in the time region (2), as shown in FIG. 5. To be more specific, after the charge of the cell capacitor Cc is read out to the bit line BLn with the word line WLn se at "H", the power supply of the bit line overdrive potential VINT was separated from the VBLH power supply line 1 with the /PSET1 set at "H" and the transistor Q10 turned off. In the third embodiment of the present invention, however, the operation to set the control signal /PSET1 at "H" is performed within the time region (3), as shown in FIG. 7.

In the third embodiment of the present invention, after the P-channel side of the sense amplifier is activated within the time region (3) with the /PSET2 set at "L" and the transistor Q8 turned on, the VBLH power supply line 1 is separated from the power supply of the bit line overdrive potential VINT with the /PSET1 set at "HH" and the transistor Q10 turned off.

In other words, even after the VBLH power supply line 1 is connected to the PCS node with the /PSET2 set at "L" and the transistor Q8 turned on, the current continues to be supplied from the power supply of the bit line overdrive potential VINT via the transistor Q10, and the VBLH power supply line 1 is separated from the bit line overdrive potential VINT with the /PSET1 set at "H" and the transistor Q10 turned off before the bit line BLn reaches the bit line final potential VBLH so as to supply the charge stored in the VBLH power supply line 1 including the charge adjusting capacitance C to the PCS node.

The particular construction of the third embodiment permits flexibly coping with various cases in the design of the bit line overdrive circuit including the case where the time for charging the VBLH power supply line 1 to the bit line overdrive potential VINT is insufficient in view of the requirement for the improved operation speed, the case where it is impossible to increase sufficiently the value of the charge adjusting capacitance C because of the limitation in the layout, and the case where it is desirable to conduct the operation to set the control signal /PSET1 at "H" after activation of the sense amplifier depending on the characteristics of the power supply of VINT.

<Fourth Embodiment>

A fourth embodiment of the present invention will now be described with reference to FIG. 8. The fourth embodiment covers the case where the bit line overdrive circuit of the present invention is applied to the DRAM of a multi-bank structure. A four bank structure is employed in, for example, a DRAM product of 256 megabits. In this case, a high speed interleave writing/reading is performed by using a bank select signal.

Figure 8:
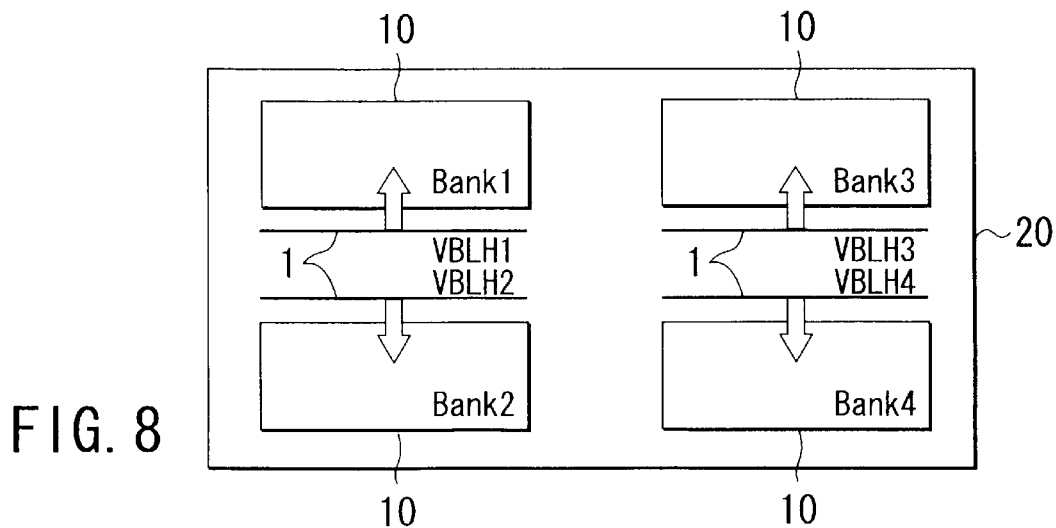
FIG. 8 shows the arrangement of the bit line overdrive circuit of a multi-bank DRAM according to a fourth embodiment of the present invention.

FIG. 8 shows as an example the arrangement of the bit line overdrive circuit of the present invention in the multi-bank DRAM of the four bank structure. In this multi-bank DRAM, a memory cell array 10 of the multi-bank structure consisting of banks 1 to 4 having VBLH power supply lines of VBLH1 to VBLH4 is formed on a semiconductor chip 20.

In the DRAM of the multi-bank structure, the word line is selected for each bank and, thus, the VBLH power supply lines described previously in conjunction with the first to third embodiments of the present invention are arranged separately from each other for each bank. On the other hand, in the conventional bit line potential overdrive circuit, it is necessary to arrange power supplies of two systems for VINT and VBLH for each sense amplifier region arranged by further dividing each bank. It is also necessary to arrange large size transistors of two system for controlling the power supplies of the two systems. In other words, the conventional bit line potential overdrive circuit requires a complex wiring, with the result that the chip size is increased.

In the bit line overdrive circuit of the present invention, however, it suffices to arrange the VBLH power supply line forming the main constituent of the circuit for each bank. Also, concerning the power supply system, it suffices to arrange only the power supply for the bit line overdrive potential VBLH. It follows that it is possible to markedly decrease the number of large size transistors and the wiring amount. Incidentally, the arrows shown in FIG. 8 denote the draw in of the wirings from the VBLH power supply line 1 arranged for each bank to the sense amplifier region divided in the bank.

To be more specific, in the bit line overdrive circuit of the present invention, it suffices to form collectively the VBLH potential generation circuit, the large size transistor Q8, Q10 and the charge adjusting capacitance, which generate a problem in terms of the layout, in the arranging region of the VBLH power supply line 1 and to simply draw the wiring in the sense amplifier region divided in each bank.

The present invention is not limited to the embodiments described above. For example, in each of the embodiments described above, the transistors Q8 and Q10 for transmitting the bit line overdrive potential were formed of P-channel transistors. However, it is also possible for these transistors Q8 and Q10 to be formed of N-channel transistors. Further, various other modifications are available within the technical scope of the present invention.

As described above, the present invention provides a semiconductor memory device equipped with a bit line overdrive circuit, particularly, the present invention provides a multi-bank semiconductor memory device. According to the semiconductor memory device of the present invention, it suffices to arrange a bit line potential overdrive circuit consisting of a power supply of a single system and a large size transistor of a single system for each bank, making it possible to decrease the chip size of the semiconductor memory device.

It should also be noted that it suffices to use a power supply system of a single system for the overdriving of the bit line potential. Since it is unnecessary to switch the power supply system as in the prior art for preventing an excessive overdriving of the bit line potential, the power supply noise can be eliminated.

What should also be noted is that, since the bit line potential overdrive circuit of the present invention is arranged for each bank, the memory core portion of the semiconductor memory device is not affected in terms of the layout.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device equipped with a bit line overdrive circuit, comprising:
    a final potential generation circuit for imparting a final potential after the overdrive to a bit line;
    a first switch having one terminal set at an overdrive potential of said bit line higher than said final potential and having the other terminal connected to the output of said final potential generation circuit;
    a second switch having one terminal connected to the other terminal of said first switch and having the other terminal connected to one activation node of a sense amplifier; and
    a charge adjusting capacitance for adjusting the potential of said bit line, one terminal of said charge adjusting capacitance being connected to the connection points between said first and second switches and the other terminal being set at a predetermined voltage.

2. The semiconductor memory device according to claim 1, wherein said bit line overdrive circuit charges the total capacitance at the connecting point between said first and second switches including said charge adjusting capacitance and the capacitance of said final potential generation circuit with said first switch turned on and said second switch turned off, and discharges the charge stored in the total capacitance in the connecting point between said first and second switches to said bit line through one activation node of said sense amplifier.

3. The semiconductor memory device according to claim 1, wherein said bit line overdrive circuit charges the total capacitance at the connecting point between said first and second switches including said charge adjusting capacitance and the capacitance of said final potential generation circuit with said first switch turned on and said second switch turned off, supplies the charging current from a power supply of said overdrive potential to said bit line through one activation node of said sense amplifier by switching said second switch to an on-state while maintaining the on-state of said first switch, and discharges the charge charged in the total capacitance at the connecting point between said first and second switches through one activation node of said sense amplifier by switching said first switch to the off-state while maintaining the on-state of said second switch.

4. The semiconductor memory device according to claim 2, wherein, in the process of discharging the charge charged in the total capacitance at the connecting point between said first and second switches to the capacitance of said bit line and the capacitance of a memory cell, the output current of said final potential generation circuit is further supplied until the potential of the capacitance of said bit line and the capacitance of said memory cell is made equal to said bit line final potential.

5. The semiconductor memory device according to claim 3, wherein, in the process of discharging the charge charged in the total capacitance at the connecting point between said first and second switches to the capacitance of said bit line and the capacitance of a memory cell, the output current of said final potential generation circuit is further supplied until the potential of the capacitance of said bit line and the capacitance of said memory cell is made equal to said bit line final potential.

6. The semiconductor memory device according to claim 1, wherein said charge adjusting capacitance consists of a plurality of capacitance elements each connected through a switch to the connecting point between said first and second switches, and the on-off operation of said switch is controlled by a signal read out from a read only memory section of said semiconductor memory device.

7. The semiconductor memory device according to claim 2, wherein said charge adjusting capacitance consists of a plurality of capacitance elements each connected through a switch to the connecting point between said first and second switches, and the on-off operation of said switch is controlled by a signal read out from a read only memory section of said semiconductor memory device.

8. The semiconductor memory device according to claim 3, wherein said charge adjusting capacitance consists of a plurality of capacitance elements each connected through a switch to the connecting point between said first and second switches, and the on-off operation of said switch is controlled by a signal read out from a read only memory section of said semiconductor memory device.

9. The semiconductor memory device according to claim 1, wherein a memory section consists of a plurality of memory banks, and said bit line overdrive circuit is arranged for each memory bank.

10. The semiconductor memory device according to claim 2, wherein a memory section consists of a plurality of memory banks, and said bit line overdrive circuit is arranged for each memory bank.

11. The semiconductor memory device according to claim 3, wherein a memory section consists of a plurality of memory banks, and said bit line overdrive circuit is arranged for each memory bank.

12. The semiconductor memory device according to claim 1, wherein said first and second switches are formed of P-channel transistors or N-channel transistors.

13. A bit line overdriving method for a semiconductor memory device, comprising:

setting one terminal of a first switch at a bit line overdrive potential higher than a bit line final potential;

connecting the other terminal of said first switch to the output of said bit line final potential generation circuit;

connecting one terminal of a second switch to the other terminal of said first switch;

connecting the other terminal of said second switch to one activation node of a sense amplifier;

connecting one terminal of a charge adjusting capacitance for adjusting the bit line potential to the connecting point between said first and second switches;

setting the other terminal of said charge adjusting capacitance at a predetermined voltage;

charging the total capacitance at the connecting point between said first and second switches including said charge adjusting capacitance and the capacitance of said bit line final potential generation circuit to said overdrive potential with said first switch turned on and said second switch turned off; and discharging the charge charged in the total capacitance at the connecting point between said first and second switches to said bit line through one activation node of said sense amplifier with said first switch turned off and said second switch turned on.

14. A bit line overdriving method for a semiconductor memory device, comprising:

setting one terminal of a first switch at a bit line overdrive potential higher than a bit line final potential;

connecting the other terminal of said first switch to the output of said bit line final potential generation circuit;

connecting one terminal of a second switch to the other terminal of said first switch;

connecting the other terminal of said second switch to one activation node of a sense amplifier;

connecting one terminal of a charge adjusting capacitance for adjusting the bit line potential to the connecting point between said first and second switches;

setting the other terminal of said charge adjusting capacitance at a predetermined voltage;

charging the total capacitance at the connecting point between said first and second switches including said charge adjusting capacitance and the capacitance of said bit line final potential generation circuit with said first switch turned on and said second switch turned off;

supplying a charging current from a power supply of said overdrive potential to said bit line through one activation node of said sense amplifier by switching said second switch to the on-state while maintaining the on-state of said first switch; and discharging the charge charged in the total capacitance at the connecting point between said first and second switches to said bit line through one activation node of said sense amplifier by switching said first switch to the off-state while maintaining the on-state of said second switch.

* * * * *